(12) United States Patent
Kim et al.

(10) Patent No.: US 12,347,646 B2
(45) Date of Patent: Jul. 1, 2025

(54) PLASMA PROCESSING APPARATUS

(71) Applicant: TOKYO ELECTRON LIMITED, Tokyo (JP)

(72) Inventors: Bongseong Kim, Miyagi (JP); Masahiro Inoue, Miyagi (JP); Mitsunori Ohata, Miyagi (JP); Ken Kobayashi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 762 days.

(21) Appl. No.: 17/314,871

(22) Filed: May 7, 2021

(65) Prior Publication Data
US 2021/0358717 A1 Nov. 18, 2021

(30) Foreign Application Priority Data

May 14, 2020 (JP) .................................. 2020-085141
Jan. 29, 2021 (JP) .................................. 2021-012816

(51) Int. Cl.
*H01L 21/306* (2006.01)
*H01J 37/32* (2006.01)
*H01L 21/3065* (2006.01)

(52) U.S. Cl.
CPC .. *H01J 37/32146* (2013.01); *H01J 37/32018* (2013.01); *H01J 37/3211* (2013.01); *H01J 37/32137* (2013.01); *H01J 37/32165* (2013.01); *H01J 37/32715* (2013.01); *H01L 21/3065* (2013.01); *H01J 2237/334* (2013.01)

(58) Field of Classification Search
CPC .......... H01J 37/32018; H01J 37/32137; H01J 37/3211; H01J 37/32146; H01J 37/32174; H01J 37/321
See application file for complete search history.

(56) References Cited

U.S. PATENT DOCUMENTS

| | | | | |
|---|---|---|---|---|
| 4,808,258 A | * | 2/1989 | Otsubo | H01J 37/32155 438/711 |
| 6,589,437 B1 | * | 7/2003 | Collins | H01J 37/32458 216/68 |
| 11,798,787 B2 | * | 10/2023 | Fujiwara | H01J 37/32174 |
| 2005/0241762 A1 | * | 11/2005 | Paterson | H01J 37/32146 156/345.28 |

(Continued)

FOREIGN PATENT DOCUMENTS

| | | |
|---|---|---|
| JP | 2018-535504 A | 11/2018 |
| KR | 20130085955 A | 7/2013 |

*Primary Examiner* — Luz L Alejandro Mulero
(74) *Attorney, Agent, or Firm* — XSENSUS LLP

(57) ABSTRACT

A plasma processing apparatus includes a plasma processing chamber, a substrate support, a source RF generator, and a bias RF generator. The substrate support is disposed within the plasma processing chamber. The source RF generator is configured to generate a source RF signal. The source RF signal includes source cycles, and each of the source cycles includes a source ON state and a source OFF state. The source ON state has at least two source power levels. The bias RF generator is coupled to the substrate support and configured to generate a bias RF signal. The bias RF signal includes bias cycles corresponding to the source cycles, respectively. Each of the bias cycles includes a bias ON state and a bias OFF state. The bias ON state has at least two bias power levels.

4 Claims, 12 Drawing Sheets

(56) References Cited

U.S. PATENT DOCUMENTS

| | | | |
|---|---|---|---|
| 2010/0330299 A1* | 12/2010 | Moon | C23C 16/517 |
| | | | 118/723 R |
| 2017/0040174 A1 | 2/2017 | Long et al. | |
| 2017/0099722 A1* | 4/2017 | Kawasaki | H05H 1/46 |
| 2017/0103871 A1* | 4/2017 | An | G01R 29/02 |
| 2020/0058469 A1* | 2/2020 | Ranjan | H01L 21/67069 |
| 2020/0058470 A1* | 2/2020 | Ventzek | H01J 37/32146 |

* cited by examiner

FIG. 3
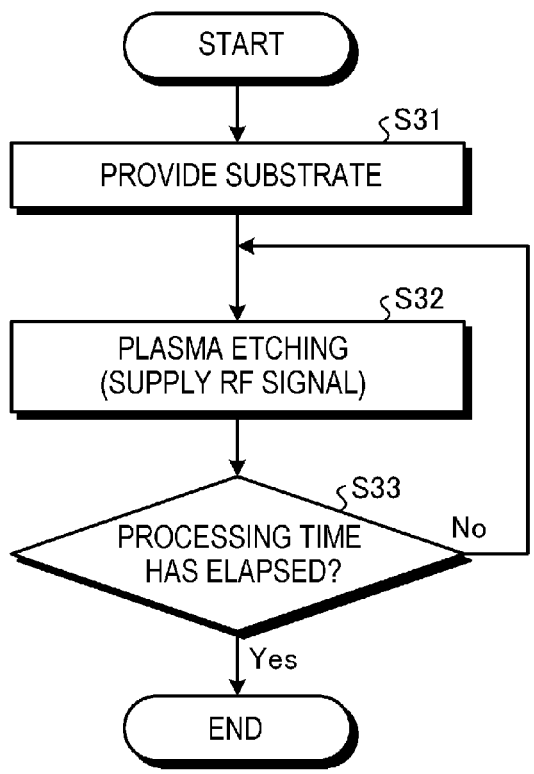
FIG. 4A   FIG. 4B   FIG. 4C
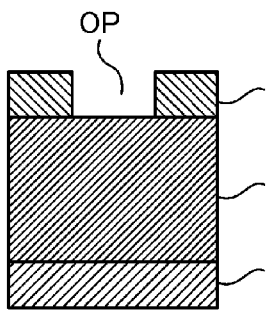 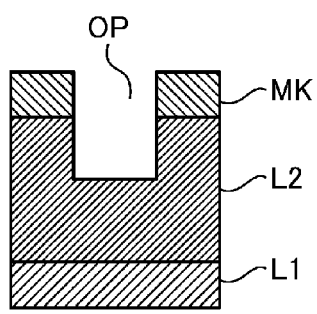 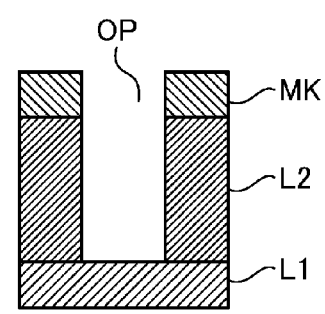

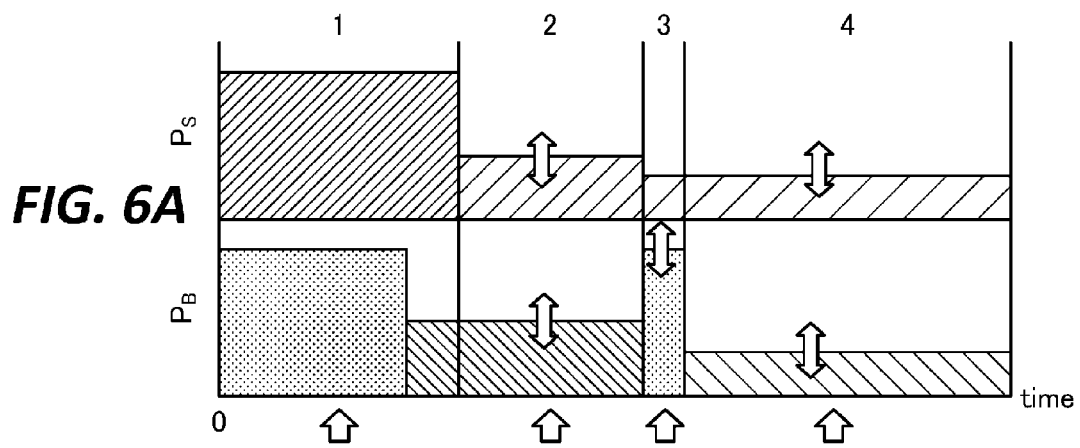
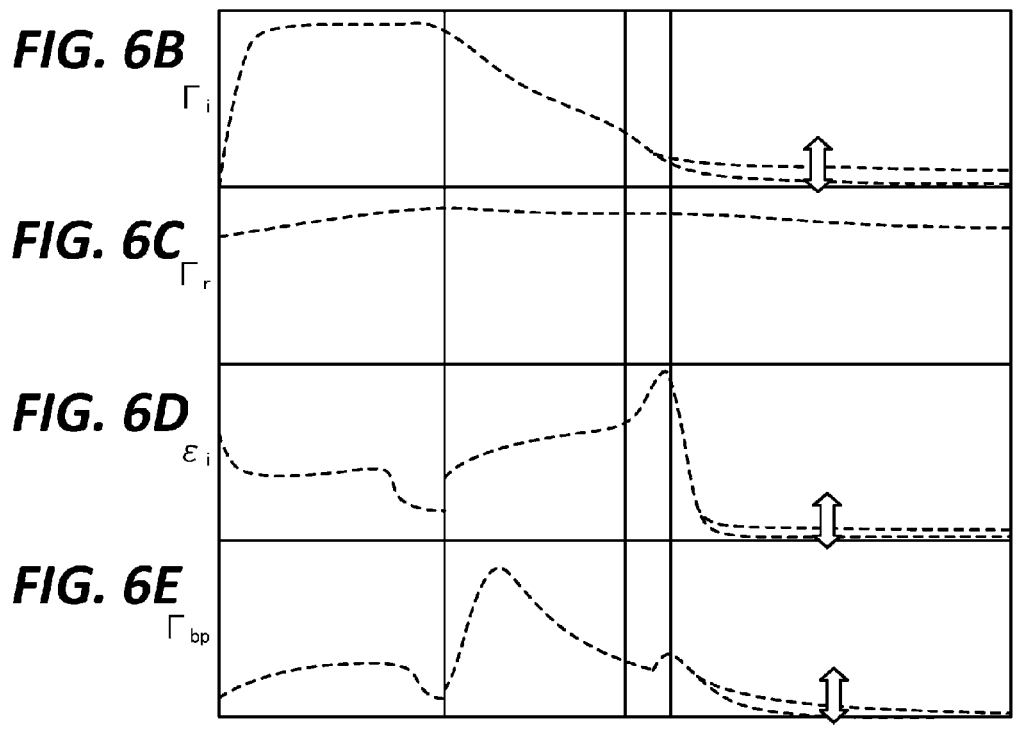

FIG. 10

| THREE-LEVEL (FIG. 5) | | THREE-LEVEL (FIG. 7) | | FOUR-LEVEL (FIG. 8) | |
|---|---|---|---|---|---|
| $P_S$ | $P_B$ | $P_S$ | $P_B$ | $P_S$ | $P_B$ |
| H | OFF | L | L | H | M |
| L | H | L | H | M | L |
| L | L | H | H | L | H |
| OFF | OFF | OFF | H | OFF | OFF |
|  |  | OFF | OFF | OFF | M |

PLASMA PROCESSING APPARATUS

CROSS-REFERENCE TO RELATED APPLICATIONS

This application is based on and claims priority from Japanese Patent Application Nos. 2020-085141 and 2021-012816 filed on May 14, 2020 and Jan. 29, 2021, respectively, with the Japan Patent Office, the disclosures of which are incorporated herein in their entireties by reference.

TECHNICAL FIELD

The present disclosure relates to a plasma processing apparatus.

BACKGROUND

US Patent Laid-Open Publication No. 2017/0040174 discloses a technology of pulsing a radio frequency (RF) signal in an apparatus using inductively coupled plasma (ICP, also referred to as transformer coupled plasma (TCP)). US Patent Laid-Open Publication No. 2017/0040174 discloses that, for example, a source RF signal supplied to a coil and a bias RF signal supplied to a chuck are synchronized such that the pulse sequences are reversed.

SUMMARY

A plasma processing apparatus according to one aspect of the present disclosure includes a plasma processing chamber, a substrate support, a source RF generator, and a bias RF generator. The substrate support is disposed within the plasma processing chamber. The source RF generator is coupled to the plasma processing chamber and configured to generate a source RF signal. The source RF signal includes source cycles, and each of the source cycles includes a source ON state and a source OFF state. The source ON state has at least two source power levels. The bias RF generator is configured to supply a bias RF signal to a lower electrode. The bias RF signal includes bias cycles corresponding to the source cycles, respectively. Each of the bias cycles includes a bias ON state and a bias OFF state. The bias ON state has at least two bias power levels. A transition timing to the bias ON state in a first bias cycle is shifted with respect to a transition timing to the source ON state in a first source cycle corresponding to the first bias cycle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a flow chart illustrating an example of the flow of plasma processing according to the embodiment.

FIGS. 4A to 4C are views illustrating an example of a substrate processed by the plasma processing according to the embodiment.

FIGS. 6A to 6E are views for explaining the relationship between values of source power and bias power and physical quantities indicating a plasma state.

FIG. 10 is a view for explaining combination sequences of power levels in supplying RF power in the plasma processing according to the embodiment.

DESCRIPTION OF EMBODIMENT

Figure 1:
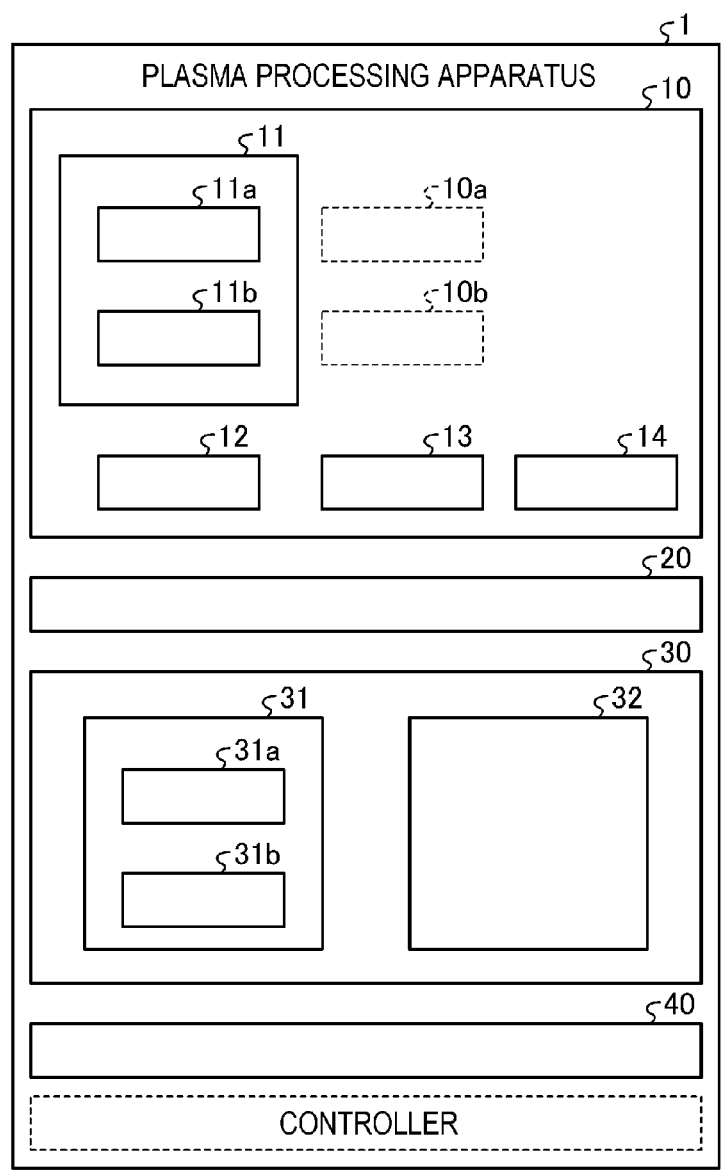
FIG. 1 is a conceptual diagram of the configuration of a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out a plasma processing apparatus according to the present disclosure (hereinafter, referred to as "embodiments") will be described in detail with reference to drawings. The present disclosure is not limited by these embodiments. The respective embodiments may be appropriately combined within a range where processing contents do not contradict each other. In each of the following embodiments, the same portions will be denoted by the same reference numerals, and redundant descriptions will be omitted.

Example of Shape Abnormality Occurring During Etching

Figure 12A:
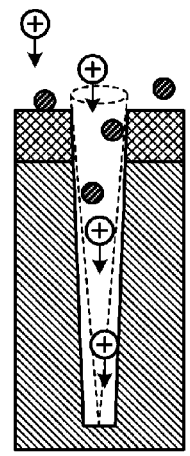
FIGS. 12A to 12C are views for explaining an example of a shape abnormality occurring during etching.
Figure 12B:
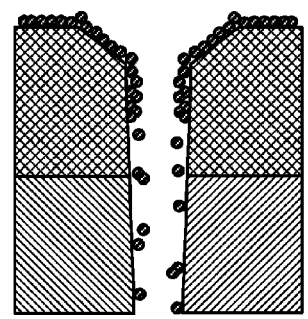
Figure 12C:
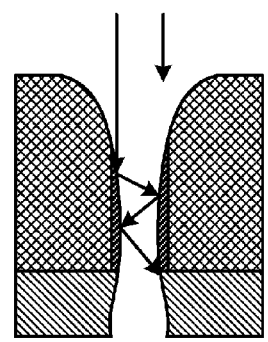

First, before description on an embodiment, an example of a shape abnormality occurring during etching of a silicon film will be described. FIGS. 12A to 12C are views for explaining an example of a shape abnormality occurring during etching of a silicon film.

In a semiconductor manufacturing technology, a technique of processing a hole with a high aspect ratio has recently attracted attention. As an example, there is a high aspect ratio contact (HARC). The HARC is used for a dynamic random access memory (DRAM) or a three-dimensional NAND. The aspect ratio of the HARC used for the DRAM is, for example, 45, and the aspect ratio of the HARC used for the three-dimensional NAND exceeds 65.

As the aspect ratio of a hole to be formed increases, it becomes difficult to form the hole straight in the vertical direction. For example, as illustrated in FIG. 12A, a phenomenon occurs in which a hole is tapered as the hole gets closer to the vicinity of a hole bottom. It is thought that the cause of this phenomenon is that, for example, the incident direction of ions in plasma becomes oblique with respect to the depth direction of the hole, and thus it is difficult to transport the ions to the hole bottom. It is thought that the ions stay in the hole, and then inhibit the course of subsequent ions.

As illustrated in FIG. 12B, in some cases, scrapings generated by etching or reaction products generated by plasma are deposited on a substrate. When such a substance is deposited near the opening of the hole, the opening of the hole is blocked, and etching does not proceed. Even if the opening is not completely blocked, products generated by etching may stay inside the hole. When the products stay inside the hole, it becomes difficult for ions to reach the inside of the hole, and thus the shape of the hole is distorted or the etching does not proceed.

In some cases, the edge of an opening of a mask is scraped by etching. In this case, as illustrated in FIG. 12C, the incident direction of ions with respect to the hole may be distorted, and a phenomenon called bowing may occur in which the ions hit the side wall of the hole and the shape of the hole is distorted into a barrel shape.

As described above, in the plasma processing with a high aspect ratio, the processing performance depends on radicals or ions generated in plasma, and reaction products generated by the plasma processing. Therefore, a technique capable of individually controlling, for example, reactive species, radicals, and by-products to be generated according to the degree of progress of the plasma processing, is required.

Embodiment

In an embodiment to be described below, RF (high frequency) power to be used at the time of plasma generation is applied in pulses so that each physical quantity as a plasma processing parameter is controlled. The physical quantities to be controlled are, for example, ion energy, an ion incident angle, radical flux, ion flux, and the amount of by-products.

A plasma processing apparatus according to the embodiment to be described below is an ICP apparatus. A controller in the plasma processing apparatus of the embodiment controls RF power (a source RF signal, source power) to be supplied to a coil (antenna) according to a control signal. In the embodiment, by the supply of the source RF signal, high density plasma is generated. The supply of the RF power may be realized in various modes. For example, on the basis of a program prepared in advance, the controller in the plasma processing apparatus may switch power supply paths from a plurality of source RF generators so as to sequentially supply source power at different power levels in pulses.

A period in which the RF power is supplied to the coil is called an ON period, and a period in which the supply of the RF power to the coil is stopped is called an OFF period. The source RF signal has a first state, for example, an ON state (a source ON state) corresponding to the ON period, and a second state, for example, an OFF state (a source OFF state) corresponding to the OFF period. The source RF signal is a pulse signal whose one cycle (a source cycle) is formed by the ON period of the first state and the OFF period of the second state subsequent thereto. The frequency of the source RF signal may be, for example, about 0.1 kHz to about 10 kHz.

In the first state, the source RF signal of the embodiment may transition to two or more levels (for example, a first source power level, and a second source power level). For example, in the first state, the source RF signal may transition between four levels. For example, the first state of the source RF signal may have a first level at which RF power having a predetermined value is supplied to the coil, a second level at which RF power having a value lower than the first level is supplied to the coil, and a third level at which RF power having a value lower than the second level is supplied to the coil. For example, the source RF signal may have a first level at which RF power of about 1300 watts at 27 MHz is supplied to the coil, a second level at which RF power of about 400 watts is supplied to the coil, and a third level at which RF power of about 50 watts is supplied to the coil. The source power of the first level may be, for example, about 300 watts to about 500 watts. The source power of the second level may be arbitrarily set according to a residual radical state. In the following description, in the first state, the first to third levels are also called a high level, a middle level, and a low level, respectively. When only two ON state levels are included in one waveform, these levels are called a high level and a low level regardless of actual values. In the following description, source powers $P_S$ of a high level, a middle level, and a low level are also denoted by $P_{SH}$, $P_{SM}$, and $P_{SL}$, respectively. When the source RF signal is in an OFF state, the value of the source power $P_S$ is also denoted by $P_{SOFF}$.

The controller also controls RF power (a bias RF signal, bias power) to be supplied to a lower electrode of the plasma processing apparatus according to a control signal. In the embodiment, by the supply of the bias RF signal, ionic bonding occurs on a substrate placed on the lower electrode, and then reactive species and radicals are generated. The supply of the RF power is realized in various modes. For example, on the basis of a program prepared in advance, the controller in the plasma processing apparatus may switch power supply paths from a plurality of bias RF generators so as to sequentially supply bias power at different power levels in pulses.

A period in which the RF power is supplied to the lower electrode is called an ON period, and a period in which the supply of the RF power to the lower electrode is stopped is called an OFF period. The bias RF signal has a first state, for example, an ON state (a bias ON state) corresponding to the ON period, and a second state, for example, an OFF state (a bias OFF state) corresponding to the OFF period. The bias RF signal is a pulse signal whose one cycle (a bias cycle) is formed by the ON period of the first state and the OFF period of the second state subsequent thereto. The frequency of the bias RF signal may be, for example, about 0.1 kHz to about 10 kHz.

In the first state, the bias RF signal of the embodiment may transition to two or more levels (for example, a first bias power level, and a second bias power level). For example, in the first state, the bias RF signal may transition between four levels. For example, the first state of the bias RF signal may have a first level at which RF power having a predetermined value is supplied to the lower electrode, a second level at which RF power having a value lower than the first level is supplied to the lower electrode, and a third level at which RF power having a value lower than the second level is supplied to the lower electrode. For example, the bias RF signal may have a first level at which RF power of about 900 watts at 13 MHz is supplied to the lower electrode, a second level at which RF power of about 270 watts is supplied to the lower electrode, and a third level at which RF power of about 180 watts is supplied to the lower electrode. The bias power of the first level may be, for example, about 300 watts to about 500 watts. The bias power of the second level may be arbitrarily set according to a residual radical state. In the following description, in the first state, the first to third levels are also called a high level, a middle level, and a low level, respectively. When only two ON state levels are included in one waveform, these levels are called a high level and a low level regardless of actual values. In the following description, bias powers $P_B$ of a high level, a middle level, and a low level are also denoted by $P_{BH}$, $P_{BM}$, and $P_{BL}$, respectively. When the bias RF signal is in an OFF state, the value of the bias power $P_B$ is also denoted by $P_{BOFF}$.

Hereinafter, first, a configuration example of a plasma processing apparatus that executes plasma processing will be described.

Figure 2:
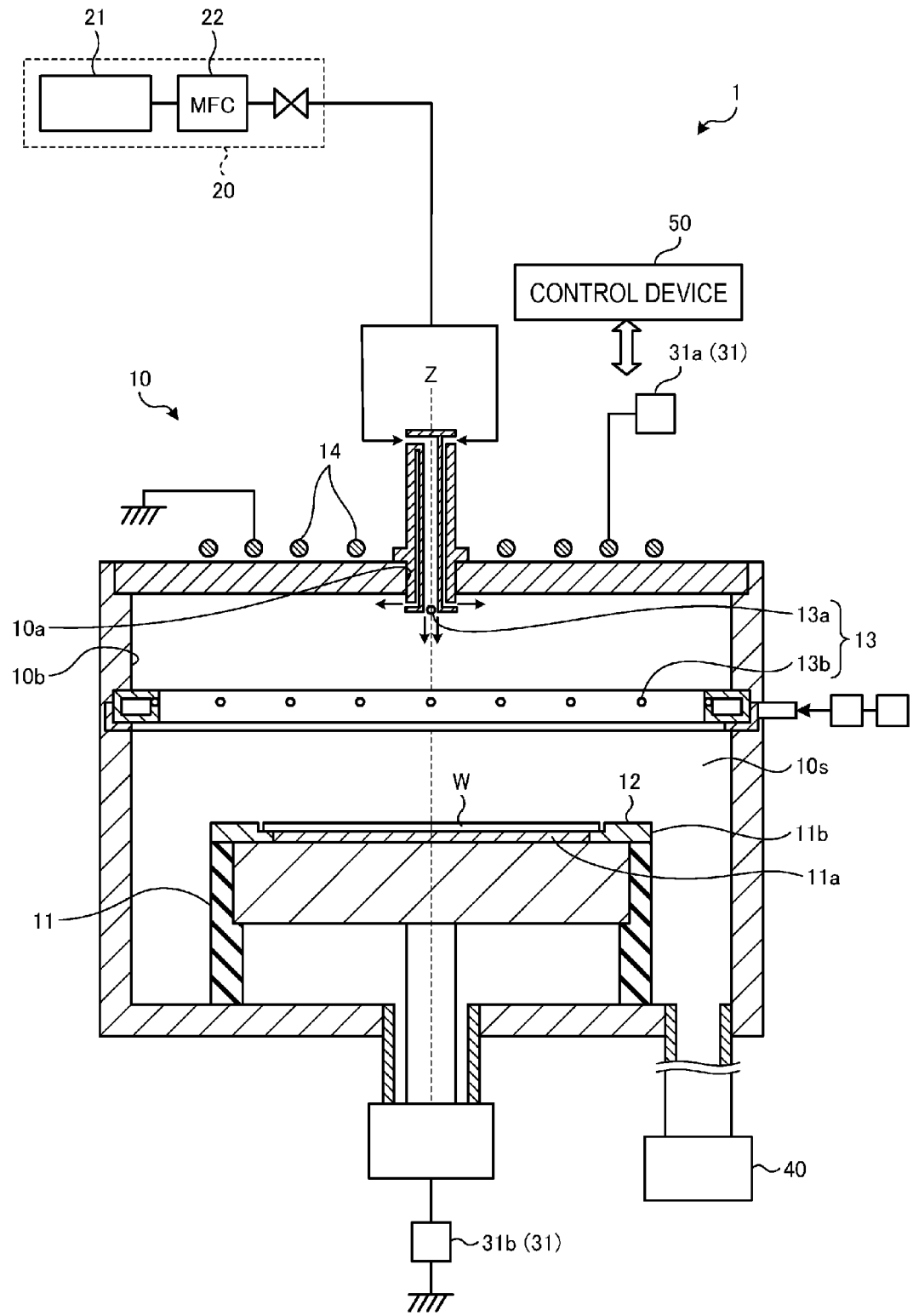
FIG. 2 is a schematic vertical-sectional view illustrating an example of the configuration of the plasma processing apparatus in FIG. 1.

Configuration Example of Plasma Processing Apparatus According to Embodiment FIG. 1 is a conceptual diagram of the configuration of a plasma processing apparatus according to an embodiment. FIG. 2 is a schematic vertical-sectional view illustrating an example of the configuration of the plasma processing apparatus in FIG. 1. Descriptions will be made on a plasma processing apparatus 1 according to the embodiment with reference to FIG. 1 and FIG. 2. The plasma processing apparatus 1 illustrated in FIG. 2 is a so-called inductively coupled plasma (ICP) apparatus, and has a plasma source for generating inductively coupled plasma.

The plasma processing apparatus 1 includes a plasma processing chamber 10, a gas supply 20, a power supply 30, and an exhaust system 40. The plasma processing chamber 10 includes a dielectric window 10a and a side wall 10b. The dielectric window 10a and the side wall 10b define a plasma processing space 10s within the plasma processing chamber 10. The plasma processing apparatus 1 includes a support 11, an edge ring 12, a gas introducer 13 and an antenna 14 disposed within the plasma processing space 10s. The support 11 includes a substrate support 11a and an edge ring support 11b. The edge ring support 11b is disposed while surrounding the outer peripheral surface of the substrate support 11a. The antenna 14 is disposed above or on the top of the plasma processing chamber 10 (the dielectric window 10a).

The substrate support 11a has a substrate support region, and is configured to support a substrate on the substrate support region. In the embodiment, the substrate support 11a includes an electrostatic chuck and a lower electrode. The lower electrode is disposed below the electrostatic chuck. The electrostatic chuck functions as the substrate support region. Although not illustrated, in the embodiment, the substrate support 11a may include a temperature control module configured to adjust at least one of the electrostatic chuck and the substrate to a target temperature. The temperature control module may include a heater, a flow path, or a combination thereof. Through the flow path, a temperature control fluid such as a coolant or a heat transfer gas flows.

The edge ring 12 is disposed on the top surface of the peripheral edge of the lower electrode while surrounding the substrate W. The edge ring support 11b has an edge ring support region, and is configured to support the edge ring 12 on the edge ring support region.

The gas introducer 13 is configured to supply at least one processing gas from the gas supply 20 to the plasma processing space 10s. In the embodiment, the gas introducer 13 includes a central gas injector 13a and/or a side wall gas injector 13b. The central gas injector 13a is disposed above the substrate support 11a, and is attached to a central opening formed in the dielectric window 10a. The side wall gas injector 13b is attached to a plurality of side wall openings formed on the side wall of the plasma processing chamber 10.

The gas supply 20 may include at least one gas source 21 and at least one flow controller 22. In the embodiment, the gas supply 20 is configured to supply one or more processing gases, from the corresponding gas sources 21, respectively, to the gas introducer through the corresponding flow controllers 22, respectively. Each flow controller 22 may include, for example, a mass flow controller or a pressure control-type flow controller. The gas supply 20 may include one or more flow modulation devices that modulate or pulse the flow rates of one or more processing gases.

The power supply 30 includes an RF power supply 31 coupled to the plasma processing chamber 10. The RF power supply 31 is configured to supply RF signals (RF power, for example, a source RF signal and a bias RF signal) to the lower electrode and the antenna 14. Accordingly, plasma is generated from at least one processing gas supplied to the plasma processing space 10s. In the embodiment, the RF signal is pulsed. Accordingly, a pulse RF signal, pulse RF power, a pulse source RF signal and a pulse bias RF signal are generated.

In the embodiment, the RF power supply 31 includes a source RF generator 31a and a bias RF generator 31b. The source RF generator 31a and the bias RF generator 31b are coupled to the plasma processing chamber 10. In the embodiment, the source RF generator 31a is coupled to the antenna 14, and the bias RF generator 31b is coupled to the lower electrode within the substrate support 11a. The source RF generator 31a is configured to generate at least one source RF signal. In the embodiment, the source RF signal has a frequency ranging from 27 MHz to 100 MHz. The generated source RF signal is supplied to the antenna 14. The bias RF generator 31b is configured to generate at least one bias RF signal. The bias RF signal has a frequency lower than the source RF signal. In the embodiment, the bias RF signal has a frequency ranging from 400 kHz to 13.56 MHz. The generated bias RF signal is supplied to the lower electrode. In various embodiments, the amplitude of at least one RF signal of the source RF signal and the bias RF signal may be pulsed or modulated. The amplitude modulation may include pulsing the amplitude of the RF signal between an ON state and an OFF state, or between two or more different ON states.

The power supply 30 may include a DC power supply 32. In the embodiment, the DC power supply 32 is configured to apply at least one DC voltage to the lower electrode. In the embodiment, at least one DC voltage may be applied to another electrode, such as an electrode within the electrostatic chuck. In the embodiment, a DC signal may be pulsed. The DC power supply 32 may be provided in addition to the RF power supply 31, or may be provided instead of the bias RF generator 31b.

The antenna 14 includes one or more coils (ICP coils). In the embodiment, the antenna 14 may include an outer coil and an inner coil which are coaxially disposed. In this case, the RF power supply 31 may be coupled to both the outer coil and the inner coil, or may be coupled to either the outer coil or the inner coil. In the former case, the same RF generator may be coupled to both the outer coil and the inner coil, or separate RF generators may be coupled to the outer coil and the inner coil separately.

The exhaust system 40 may be connected to, for example, an exhaust port (a gas outlet) provided at the bottom of the plasma processing chamber 10. The exhaust system 40 may include a pressure valve and a vacuum pump. The vacuum pump may include a turbo molecular pump, a roughing pump or a combination thereof.

In the embodiment, a controller (corresponding to a control device 50 in FIG. 2) processes computer-executable instructions which cause the plasma processing apparatus 1 to execute various steps described in the present disclosure. The controller may be configured to control each element of the plasma processing apparatus 1 so that various steps described herein are executed. In the embodiment, a part or all of the controller may be included in the plasma processing apparatus 1. The controller may include, for example, a computer. The computer may include, for example, a processor (CPU: central processing unit), a storage and a communication interface. The processor may be configured to perform various control operations on the basis of a program stored in the storage. The storage may include a random access memory (RAM), a read only memory (ROM), a hard disk drive (HDD), a solid state drive (SSD), or a combination thereof. The communication interface may communicate with the plasma processing apparatus 1 via a communication line such as a local area network (LAN).

Flow of Plasma Processing According to Embodiment

FIG. 3 is a flow chart illustrating an example of the flow of plasma processing according to the embodiment. The plasma processing illustrated in FIG. 3 may be carried out in the plasma processing apparatus 1 of FIGS. 1 and 2. FIGS. 4A to 4C are views illustrating an example of a substrate processed by the plasma processing according to the embodiment.

First, a substrate W is provided within the plasma processing chamber 10 (step S31). As illustrated in FIGS. 4A to 4C, the substrate W includes, for example, an underlayer L1, an etching target layer (for example, a Si layer) L2, and a mask MK which are sequentially formed on a silicon substrate. A recess OP is formed on the substrate W in advance (see FIG. 4A). The recess OP may be formed in the plasma processing apparatus 1. Next, the plasma processing apparatus 1 is controlled by a controller so that a gas for etching is supplied from the gas supply 20 into the plasma processing chamber 10. The plasma processing apparatus 1 is controlled by the controller so that RF power is supplied from the RF power supply 31 (the source RF generator 31a and the bias RF generator 31b) to the antenna (coil) 14 and the lower electrode. Here, the RF power supply 31 supplies RF power at levels corresponding to the waveforms of RF signals, to the lower electrode and the antenna 14. The waveforms of the RF signals will be described below. As the RF power is supplied, plasma of the gas supplied into the plasma processing chamber 10 is generated, and plasma etching is executed (step S32). By the plasma etching, the bottom of the recess OP formed on the mask MK of the substrate W is scraped, and the recess OP is gradually deepened (see FIG. 4B). Then, the controller of the plasma processing apparatus 1 determines whether a predetermined processing time has elapsed (step S33). When the predetermined processing time elapses, the bottom of the recess OP reaches the underlayer L1, and a shape illustrated in FIG. 4C is formed. When determining that the processing time has not elapsed (step S33, No), the controller returns to step S32 and continues the plasma etching. Meanwhile, when determining that the processing time has elapsed (step S33, Yes), the controller ends the processing.

During the plasma etching in step S32, the plasma processing apparatus 1 according to the embodiment supplies a source RF signal and a bias RF signal from the source RF generator 31a and the bias RF generator 31b, respectively. The plasma processing apparatus 1 controls, for example, ions and radicals in the plasma, and the amount of by-products generated by the plasma etching according to waveforms of the source RF signal and the bias RF signal. The plasma processing apparatus 1 according to the embodiment controls the waveform of the source RF signal and the waveform of the bias RF signal, separately. For example, the plasma processing apparatus 1 may set the bias RF signal to an ON state when the source RF signal is in an OFF state. The plasma processing apparatus 1 may set the bias RF signal to an OFF state when the source RF signal is in an ON state. The plasma processing apparatus 1 may separately control power levels when the source RF signal and the bias RF signal are in ON states. Next, the waveforms of the source RF signal and the bias RF signal will be described.

Waveform Example of RF Signal

Figure 5:
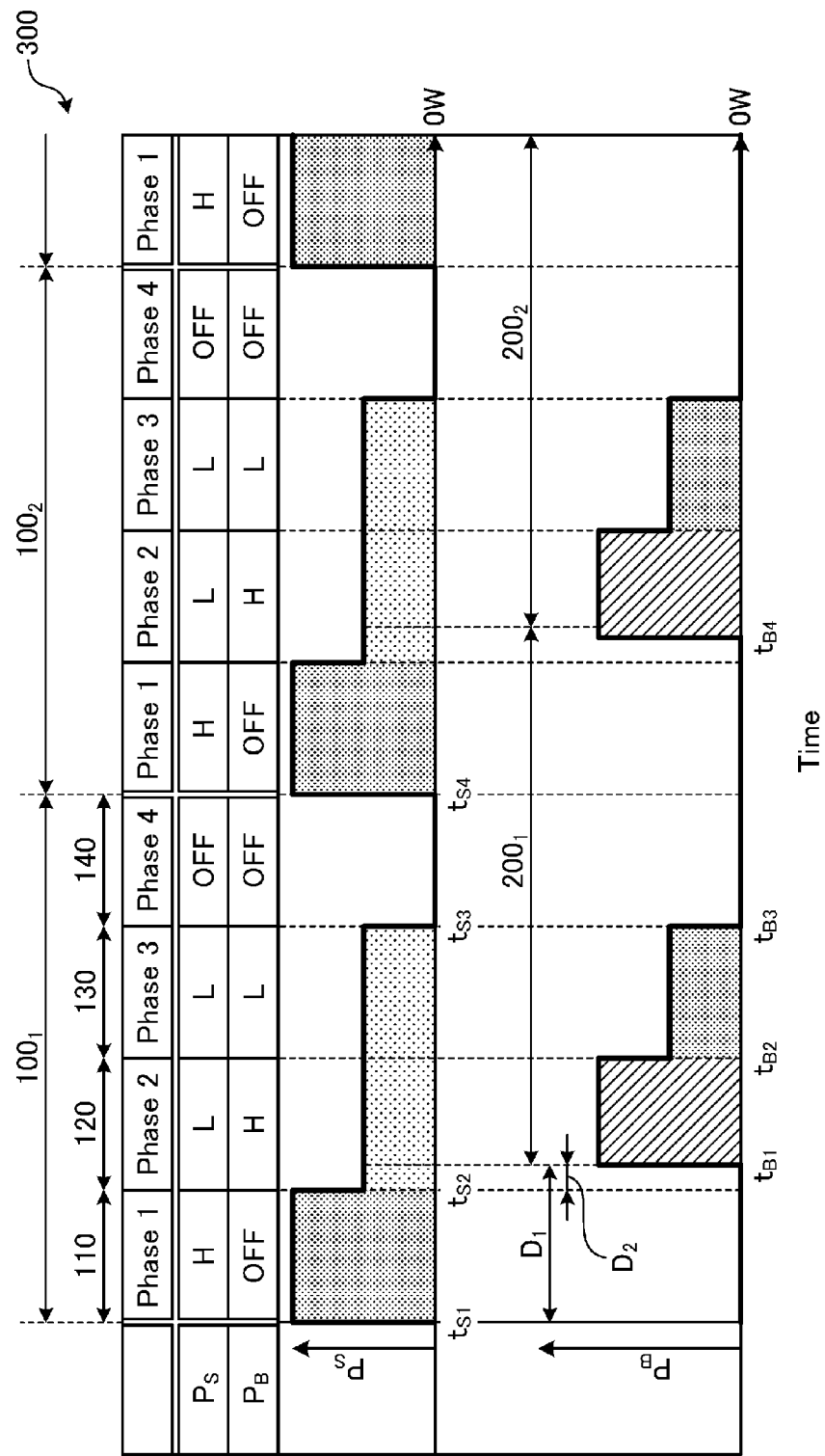
FIG. 5 is a view for explaining an example of three-level waveforms of RF signals used for the plasma processing according to the embodiment.

FIG. 5 is a view illustrating an example of waveforms of RF signals used for supplying RF power in the plasma processing according to the embodiment.

A timing chart 300 illustrated in FIG. 5 illustrates source power (a source RF signal) $P_S$ and bias power (a bias RF signal) $P_B$. The source power $P_S$ is RF power supplied from the source RF generator 31a to the antenna (coil) 14. The bias power $P_B$ is RF power supplied from the bias RF generator 31b to the lower electrode in the substrate support 11a. The source RF generator 31a generates the source power $P_S$ according to, for example, a control signal supplied from the controller. The generated source power $P_S$ is supplied to the coil. The bias RF generator 31b generates the bias power $P_B$ according to, for example, a control signal supplied from the controller. The generated bias power $P_B$ is supplied to the lower electrode.

In FIG. 5, a cycle 100 indicates one cycle of the source RF signal.

Hereinafter, cycles $100_1$, $100_2$, . . . will be collectively referred to as the cycle 100 when the cycles are not required to be distinguished from each other. A cycle 200 indicates one cycle of the bias RF signal. Hereinafter, cycles $200_1$, $200_2$, . . . will be collectively referred to as the cycle 200 when the cycles are not required to be distinguished from each other. One cycle refers to a period from the rise of a pulse signal to the following rise, that is, the total period of an ON period and an OFF period. The source RF signal and the bias RF signal are pulse signals having the same frequencies.

The source RF signal repeats a source ON state as a state where the RF power is supplied to the coil (a first state: see Phase 1 to Phase 3 in FIG. 5), and a source OFF state as a state where the RF power is not supplied to the coil (a second state: see Phase 4 in FIG. 5). When the source RF signal is in the source ON state, the source power $P_S$ is supplied to the coil. When the source RF signal is in the source OFF state, the power is not supplied to the coil, that is, the supply of the RF power to the coil is stopped. Each source ON state has at least two source power levels (High/Low). In the example illustrated in FIG. 5, the source ON state has a first source power level (High) during a first source period (Phase 1), and a second source power level (Low) during a second source period (Phases 2, and 3) subsequent to the first source period (Phase 1). That is, in the example of FIG. 5, the first source power level (High) is higher than the second source power level (Low).

The bias RF signal repeats a bias ON state as a state where the RF power is supplied to the lower electrode (a first state: see Phase 2 excluding a period $D_2$ to Phase 3 in FIG. 5), and an OFF state as a state where the RF power is not supplied to the lower electrode (a second state; see Phase 4 in FIG. 5). In the example of FIG. 5, when the bias RF signal is in the ON state, the bias power $P_B$ is supplied to the lower electrode. When the bias RF signal is in the OFF state, the power is not supplied to the lower electrode, that is, the supply of the RF power to the lower electrode is stopped. Each bias ON state has at least two bias power levels (High/Low). In the example illustrated in FIG. 5, the bias ON state has a first bias power level (High) during a first bias period (Phase 2 excluding the period $D_2$), and a second bias power level (Low) during a second bias period (Phase 3) subsequent to the first bias period Phase 2 excluding the period $D_2$). That is, in the example of FIG. 5, the first bias power level (High) is higher than the second bias power level (Low).

In FIG. 5, the rise of the bias RF signal (timing $t_{B1}$) is delayed by a period $D_1$ with respect to the rise of the source RF signal (timing $t_{S1}$). That is, the cycle 100 of the source RF signal is shifted with respect to the cycle 200 of the bias RF signal by the period $D_1$. The bias RF signal rises after the period $D_2$ after the source RF signal transitions from the high level in the ON state (H in FIG. 5) to the low level (L in FIG. 5) (timing $t_{S2}$). In the example of FIG. 5, the timing $t_{B1}$ of the transition from the bias OFF state in the previous bias cycle to the bias ON state (High) in the first bias cycle $200_1$ is shifted with respect to (is delayed from) the timing $t_{S1}$ of the transition to the source ON state (High) in the first source cycle $100_1$ corresponding to the first bias cycle $200_1$. The bias RF signal has a bias OFF period during the first source period (Phase 1).

Next, while the source RF signal is maintained at the low level, the bias RF signal transitions from the high level to the low level (timing $t_{B2}$). Therefore, the first bias period (Phase 2 excluding the period $D_2$) and the second bias period (Phase 3) partially overlap the second source period (Phases 2 and 3). The bias RF signal transitions from the first bias power level (High) to the second bias power level (Low) during the second source period (Phases 2 and 3), and then, simultaneously with the timing (timing $t_{S3}$) when the source RF signal transitions from the low level to the OFF state, the bias RF signal transitions to the OFF state (timing $t_{B3}$). Therefore, in Phase 4 of FIG. 5, the period in the source OFF state overlaps the period in the bias OFF state.

After the transition to the OFF state, the source RF signal transitions to the ON state at the timing $t_{S4}$, and then the following cycle $100_2$ starts. Meanwhile, the bias RF signal is maintained in the OFF state at the timing $t_{S4}$. Then, at the timing $t_{B4}$ delayed by the period $D_1$ from the rise of the source RF signal, the bias RF signal transitions from the OFF state to the ON state.

As described above, the timing of the state transition of the source RF signal is shifted with respect to the timing of the state transition of the bias RF signal. In the example of FIG. 5, the timing at which the source RF signal transitions from the high level to the low level is shifted with respect to the timing at which the bias RF signal transitions from the OFF state to the ON state, by the period $D_2$. The state of the source RF signal and the state of the bias RF signal are transitioned asymmetrically.

The length of each of the ON period (timings $t_{S1}$ to $t_{S3}$), and the OFF period (timings $t_{S3}$ to $t_{S4}$) of the source RF signal is different from the length of each of the ON period (timings $t_{B1}$ to $t_{B3}$) and the OFF period (timings $t_{B3}$ to $t_{B4}$) of the bias RF signal. In the example of FIG. 5, the duty ratio of the source RF signal (the ratio of the length of the ON period to one cycle) is about 75%. The duty ratio of the bias RF signal is about 40%. Meanwhile, the source RF signal and the bias RF signal may have the same duty ratios. Each of the duty ratios of the source RF signal and the bias RF signal may be individually set within a range of about 3% to about 90%. The duty ratios of the source RF signal and the bias RF signal will be further described below.

The supply mode of the source power $P_S$ and the bias power $P_B$ transitions between the following four phases.

(1) First phase (the reference numeral 110 in FIG. 5, film formation mode):

A first phase 110 is defined by a parameter set {$P_{S1}$, $P_{B1}$, $t_1$}. Here, $P_{S1}$ is a value of the source power $P_S$ supplied during the first phase 110. $P_{B1}$ is a value of the bias power $P_B$ supplied during the first phase 110. $t_1$ indicates the length of the period of the first phase 110. Here, the following relationships are established.

$$P_{S1}>0$$

$$P_{B1}=0$$

$$t_1>0$$

During the first phase 110, the source power $P_S$, at the high level, is supplied to the coil whereas the bias power $P_B$ is not supplied to the lower electrode. During the first phase 110, the RF power is supplied to only the upper portion of the plasma processing apparatus 1 so that plasma is generated, and ions and radicals are generated in the plasma. As compared to the case where the bias power $P_B$ is also supplied in the overlapping manner, a small amount of radicals or ions are generated. However, since there is no drawing force by the bias power $P_B$, film formation mainly proceeds on the substrate.

(2) Second phase (the reference numeral 120 in FIG. 5, high selectivity etching mode):

A second phase 120 is defined by parameter sets {$P_{S2}$, $P_{B2}$, $t_2$} and {$P_{S3}$, $P_{B3}$, $t_3$}. Here, $P_{S2}$ is a value of the source power $P_S$ supplied during the period $D_2$ in the second phase 120. $P_{B2}$ is a value of the bias power $P_B$ supplied during the period $D_2$ in the second phase 120. $t_2$ indicates the length of the period $D_2$ in the second phase 120. $D_2$ indicates the length of a delay period from the start of the second phase 120 to the start of the supply of the bias power PB. Herein, the following relationships are established.

$$P_{S1}>P_{S2}>0$$

$$P_{B2}=0$$

$$t_2=D_2>0$$

$P_{S3}$ is a value of the source power $P_S$ supplied during the period excluding the period $D_2$ in the second phase 120. $P_{B3}$ is a value of the bias power $P_B$ supplied during the period excluding the period $D_2$, in the second phase 120. $t_3$ indicates the length of the period excluding the period $D_2$ in the second phase 120. Here, the following relationships are established.

$$P_{S3}=P_{S2}>0$$

$$P_{B3}>0$$

$$t_3>0$$

At the time of start of the second phase 120 (timing $t_{S2}$), the level of the source power $P_S$ is switched from the high level to the low level. After the period $D_2$ elapses from the start of the second phase 120 (timing $t_{B1}$), the bias power $P_B$ transitions to the ON state (high level). The period $D_2$ corresponds to the exhaust time of an etching product. During the second phase 120, the bias power $P_B$ is supplied so that a drawing force (ion energy) of ions toward the lower electrode is generated. The supply of the source power $P_S$ transitions to the low level but is continued. Thus, etching with a high selectivity proceeds.

(3) Third phase (the reference numeral 130 in FIG. 5, mild etching mode):

A third phase 130 is defined by a parameter set $\{P_{S4}, P_{B4}, t_4\}$. Here, $P_{S4}$ is a value of the source power $P_S$ supplied during the third phase 130. $P_{B4}$ is a value of the bias power $P_B$ supplied during the third phase 130. $t_4$ indicates the length of the period of the third phase 130. Here, the following relationships are established.

$$P_{S2}=P_{S3}=P_{S4}$$

$$P_{B3}>P_{B4}>0$$

$$t_4>0$$

At the time of start of the third phase 130 (timing $t_{B2}$), the bias power $P_B$ is switched from the high level to the low level. Meanwhile, the source power $P_S$ is still maintained at the low level. Thus, the amount of radicals and ions in the plasma processing space 10*s* is not largely reduced, but the drawing force (ion energy) of ions toward the substrate is reduced. For this reason, etching is suppressed at the bottom of the recess OP, and the vicinity of the top of the recess OP is etched rather than the bottom so that the opening is prevented from being blocked by deposited substances.

(4) Fourth phase (the reference numeral 140 in FIG. 5, exhaust mode):

A fourth phase 140 is defined by a parameter set $\{P_{S5}, P_{B5}, t_5\}$. Here, $P_{S5}$ is a value of the source power $P_S$ supplied during the fourth phase 140. $P_{B5}$ is a value of the bias power $P_B$ supplied during the fourth phase 140. $t_5$ indicates the length of the period of the fourth phase 140. Here, the following relationships are established.

$$P_{S5}=P_{B5}=0$$

$$t_5>0$$

At the time of start of the fourth phase 140 (timings $t_{S3}$ and $t_{B3}$), both the source power $P_S$ and the bias power $P_B$ transition to the OFF states. Therefore, generation of the plasma within the plasma processing space 10*s* is stopped, and all of the radical density, the ion density, and the ion energy are reduced. Here, since the exhaust system 40 continues to operate, radicals or by-products are gradually exhausted from the inside of the plasma processing space 10*s*.

After the fourth phase, the source power $P_S$, which returns to the first phase again, is applied. Due to the application of the source power $P_S$, plasma is generated again.

As described above, in the plasma processing according to the embodiment, states of the source power $P_S$ and the bias power $P_B$ are transitioned at different timings. The source power $P_S$ and the bias power $P_B$ are transitioned in an asymmetric state. For this reason, the plasma processing apparatus 1 according to the embodiment may perform a control such that the state of the plasma within the plasma processing space 10*s* becomes states suitable for desired plasma processing. Therefore, the plasma processing apparatus 1 may efficiently form a pattern having a desired shape on the substrate. The plasma processing apparatus 1 uses the source RF signal and the bias RF signal having, for example, pulse waveforms of FIG. 5 so that states of ions, radicals, and by-products within the plasma processing space 10*s* may be controlled to realize vertical etching. Thus, the plasma processing apparatus 1 may improve the processing performance of the plasma etching while suppressing the shape abnormality occurring by the etching.

In the example of FIG. 5, the following relationships are established.

$$P_{S1}>P_{S2}=P_{S3}=P_{S4}>0$$

$$P_{B3}>P_{B4}>0$$

$$P_{B1}=P_{B2}=P_{B5}=P_{S5}=0$$

$$t_1>0$$

$$t_2=D_2>0$$

$$t_3>0$$

$$t_4>0$$

$$t_5>0$$

Meanwhile, the embodiment may be applied to not only the case where the relationships are established, but also other relationships. In relation to other relationships, modifications will be described below.

FIGS. 6A to 6E are views for explaining the relationship between values of the source power $P_S$ and the bias power $P_B$ and physical quantities indicating a plasma state.

The waveform example illustrated in FIG. 6A is a waveform example set for an experiment. Descriptions will be made on the waveform example of FIG. 6A which are divided into periods 1 to 4. During the periods 1, 2, and 3, the value of the source power $P_S$ transitions in the order of a high level, a middle level, and a low level, respectively. During the period 3 and the period 4, the value of the source power $P_S$ does not change. During the periods 1 to 4, the value of the bias power $P_B$ transitions in the order of a high level, a middle level, a high level, and a low level, respectively.

FIGS. 6B, 6C, 6D, and 6E correspond to changes of the power values in FIG. 6A, and illustrate changes of an ion density $\Gamma_i$, a radical density $\Gamma_r$, ion energy $\varepsilon_i$, and a by-product density $\Gamma_{bp}$, respectively within the plasma processing space 10*s*.

In the case of an inductive coupling type, a wave excitation type, and an ECR type, it can be said that the amount of generated reactive species correlates with the source power $P_S$. Thus, in the step of firstly generating reactive species at the time of start of plasma processing, the source power $P_S$ is set to the high level. The ion density $\Gamma_i$ or the radical density $\Gamma_r$ also increases in the period 1 in which the supply amount of the source power $P_S$ is large. For this reason, it can be said that supplying the source power $P_S$ at the high level as in the period 1 is effective for efficient film formation or etching.

However, when the source power $P_S$ is continuously supplied at the high level, the by-product density $\Gamma_{bp}$ also increases. $\Gamma_{bp}$ increases during the period 2 in which both the source power $P_S$ and the bias power $P_B$ are lowered from the high levels to the middle levels. It is thought that this is because the bias power $P_B$ is relatively high and thus the etching effect is strengthened by the increased ion energy, and by-products generated by etching are increased. The ion energy increases in a spike shape during the period 3 in which the bias power $P_B$ is returned to the high level. In the period 3, the source power $P_S$ has the low level, but no significant reduction is seen in the radical density $\Gamma_r$. The ion density $\Gamma_i$ is gradually reduced. Then, in the period 4 in which both the source power $P_S$ and the bias power $P_B$ are at the low levels, all three physical quantities other than the radical density $\Gamma_r$ are reduced and approach 0. In particular, the ion energy $\varepsilon_i$ and the by-product density $\Gamma_{bp}$ are greatly reduced.

When the source power $P_S$ and the bias power $P_B$ are simultaneously supplied at the high levels as in the period 1, the amounts of radicals and ions may be rapidly increased. Thus, it is thought that it is desirable to supply the source power $P_S$ and the bias power $P_B$ at the high levels at the time of start of the plasma processing.

Next, when the level of the source power $P_S$ is lowered as in the period 2, even if ions are reduced, the amount of radicals is not changed so much. Meanwhile, when the bias power $P_B$ is maintained at a relatively high level, the ion energy may be increased. For this reason, through level control of the bias power $P_B$, the ion incident angle may be adjusted so that vertical etching may be effectively realized. It is thought that firstly lowering the level of the bias power $P_B$ during the period 1, and after a certain delay, lowering the level of the source power $P_S$ affect the ion energy or the amount of by-products. Thus, it is thought that by adjusting the switch timing of the level of the source power $P_S$, it is possible to control the amount of by-products or the fluctuation of the ion energy. It can be said that by adjusting the level of the bias power $P_B$, it is possible to control the ion energy so that the ratios of ions and radicals may be adjusted. Thus, through level adjustment of the bias power $P_B$, it is possible to further adjust the etching angle so that a pattern may be effectively etched.

When the bias power $P_B$ is returned to the high level, as in the period 3, the spike-shape increase of the ion energy brings the ion incident angle closer to perpendicular to the substrate surface during etching. Thus, it can be said that the level adjustment of the bias power $P_B$ is also useful for effectively realizing etching of the bottom of the pattern. From the waveform example of FIG. 6A, it is thought that setting the source power $P_S$ to a relatively low level, and setting the bias power $P_B$ to a high level are useful for vertically etching the side wall of the pattern. It can be said that the spike-shape increase of the ion energy in the period 3 is effective in etching the corner of the bottom of the recess OP on the substrate.

It is thought that as in the period 4, when both the source power $P_S$ and the bias power $P_B$ are set to the low levels, the by-products may be exhausted at a high speed.

It is thought that in the waveforms of FIG. 6A, when the level of the source power $P_S$ in the periods 2 and 4, and the level of the bias power $P_B$ in the periods 2 to 4 are adjusted, it is possible to further adjust a position or an angle at which etching proceeds in the pattern.

In the waveform example of FIG. 5, in the first phase 110, the source power $P_S$ is supplied at the high level to generate reactive species, and then, in the second phase 120, the source power $P_S$ is lowered to the low level. At this step, the bias power $P_B$ is supplied at the high level to increase the ion energy and to relatively strengthen the drawing (biasing) force toward the substrate so that etching proceeds. Then, in the third phase, the bias power $P_B$ is switched to the low level to weaken the drawing force so that the top side of the pattern is etched, and blockage is suppressed. Then, both the source power $P_S$ and the bias power $P_B$ are transitioned to the OFF states so that by-products staying in, for example, the opening are exhausted.

In this manner, by combining and sequencing levels of each of the source power $P_S$ and the bias power $P_B$ according to the shape of the pattern to be formed, it is possible to realize the supply of the RF power suitable for formation of various patterns.

Figure 7:
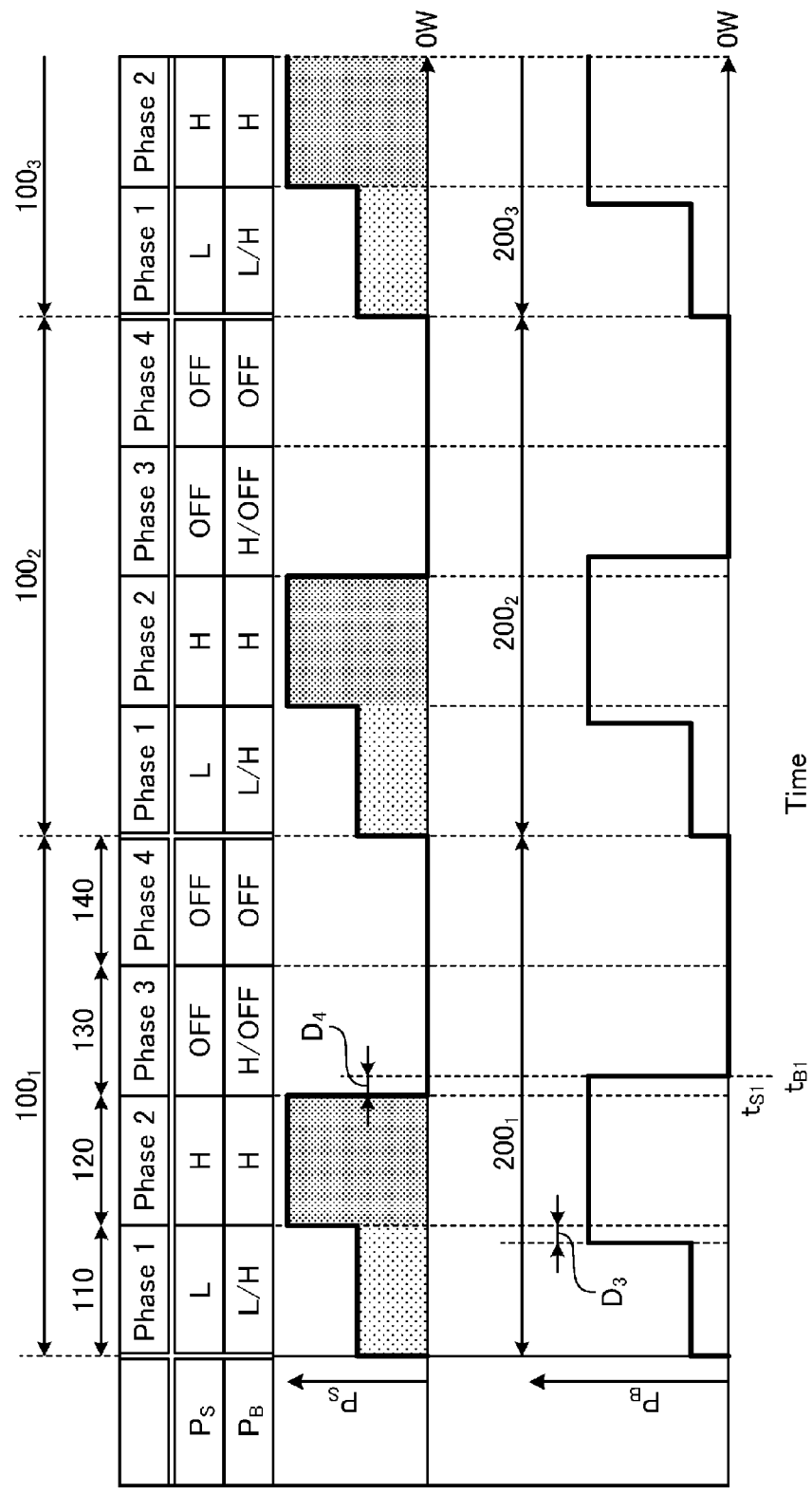
FIG. 7 is a view for explaining another example of three-level waveforms of RF signals used for the plasma processing according to the embodiment.

FIG. 7 is a view for explaining another example of three-level waveforms of RF signals used for the plasma processing according to the embodiment. In the waveform example in FIG. 7, the level of each of the source power $P_S$ and the bias power $P_B$ is transitioned in the order of a low level, a high level, and an OFF state. The source power $P_S$ and the bias power $P_B$ transition from the OFF states to the ON states at the same timings. The timing at which the source power $P_S$ transitions from the low level to the high level is delayed from the timing at which the bias power $P_B$ transitions from the low level to the high level, by a period $D_3$. The timing at which the bias power $P_B$ transitions from the high level to the OFF state is delayed from the timing at which the source power $P_S$ transitions from the high level to the OFF state, by a period $D_4$.

Like the waveform example of FIG. 5, the waveform example of FIG. 7 includes four phases from a first phase to a fourth phase.

In the first phase 110, both the source power $P_S$ and the bias power $P_B$ are supplied at the low levels. Thus, reactive species are generated, and ion energy is generated so that a drawing force is generated. Since the bias power $P_B$ is supplied at the low level, the vicinity of the top of a pattern is gradually etched. Thus, abnormalities caused by rapid etching, such as blockage of an opening by a product, are suppressed.

The bias power $P_B$ transitions from the low level to the high level before the first phase 110 is ended. Thus, the ion energy rises before the start of the second phase 120. Then, when the second phase 120 is reached, both the source power $P_S$ and the bias power $P_B$ have the high levels, and then etching proceeds.

Next, when the third phase 130 starts, first, the source power $P_S$ transitions to the OFF state. Thus, a state in which only the bias power $P_B$ is applied at the high level is made, and the bottom of the pattern is etched so that the pattern shape is vertically corrected.

Next, in the fourth phase 140, both the source power $P_S$ and the bias power $P_B$ are placed in the OFF states. Thus, exhaustion of, for example, by-products within the plasma processing space 10s proceeds. Then, until the following cycle 1002 starts, by-products which interfere with the etching effect are exhausted.

In the example of FIG. 7, the relationship between each phase and a parameter set is as follows. The first phase 110 is defined by parameter sets $\{P_{S1}, P_{B1}, t_1\}$ and $\{P_{S2}, P_{B2}, t_2\}$. The second phase 120 is defined by a parameter set $\{P_{S3}, P_{B3}, t_3\}$. The third phase 130 is defined by parameter sets $\{P_{S4}, P_{B4}, t_4\}$ and $\{P_{S5}, P_{B5}, t_5\}$. The fourth phase 140 is defined by a parameter set $\{P_{S6}, P_{B6}, t_6\}$.

In each phase, a parameter set is defined for each period in which the source power $P_S$ and the bias power $P_B$ have constant values. In the example of FIG. 7, six parameter sets are defined.

The first parameter set $\{P_{S1}, P_{B1}, t_1\}$ corresponds to a period in which the source power $P_S$ has the low level, and the bias power $P_B$ has the low level, in the first phase. Therefore, the following relationships are established.

$$P_{S1}=P_{SL}$$

$$P_{B1}=P_{BL}$$

$$t_1>0$$

The second parameter set $\{P_{S2}, P_{B2}, t_2\}$ corresponds to a period in which the source power $P_S$ has the low level, and the bias power $P_B$ has the high level, in the first phase. Therefore, the following relationships are established.

$$P_{S2}=P_{SL}$$

$$P_{B2}=P_{BH}$$

$$t_2 D_3>0$$

The third parameter set $\{P_{S3}, P_{B3}, t_3\}$ corresponds to a period in which the source power $P_S$ has the high level, and the bias power $P_B$ has the high level, in the second phase. Therefore, the following relationships are established.

$$P_{S3}=P_{SH}$$

$$P_{B3}=P_{BH}$$

$$t_3>0$$

The fourth parameter set $\{P_{S4}, P_{B4}, t_4\}$ corresponds to a period in which the source power $P_S$ is in the OFF state, and the bias power $P_B$ has the high level, in the third phase. Therefore, the following relationships are established.

$$P_{S4}=P_{SOFF}$$

$$P_{B4}=P_{BH}$$

$$t_4=D_4>0$$

The fifth parameter set $\{P_{S5}, P_{B5}, t_5\}$ corresponds to a period in which the source power $P_S$ is in the OFF state, and the bias power $P_B$ is in the OFF state, in the third phase. Therefore, the following relationships are established.

$$P_{S5}=P_{SOFF}$$

$$P_{B5}=P_{BOFF}$$

$$t_5>0$$

The sixth parameter set $\{P_{S6}, P_{B6}, t_6\}$ corresponds to a period in which the source power $P_S$ is in the OFF state, and the bias power $P_B$ is in the OFF state, in the fourth phase. Therefore, the following relationships are established.

$$P_{S6}=P_{SOFF}$$

$$P_{B6}=P_{BOFF}$$

$$t_6>0$$

In summary, the following relationships are established.

$$P_{S3}>P_{S1}=P_{S2}>0=P_{S4}=P_{S5}=P_{S6}$$

$$P_{B2}=P_{B3}=P_{B4}>P_{B1}>0=P_{B5}=P_{B6}$$

As described above, in the example of FIG. 7, the timing $t_{B1}$ of the transition to the bias OFF state in the first bias cycle 200$_1$ is shifted with respect to (is delayed from) the timing $t_{S1}$ of the transition to the source OFF state in the first source cycle 100$_1$ corresponding to the first bias cycle 200$_1$.

Figure 8:
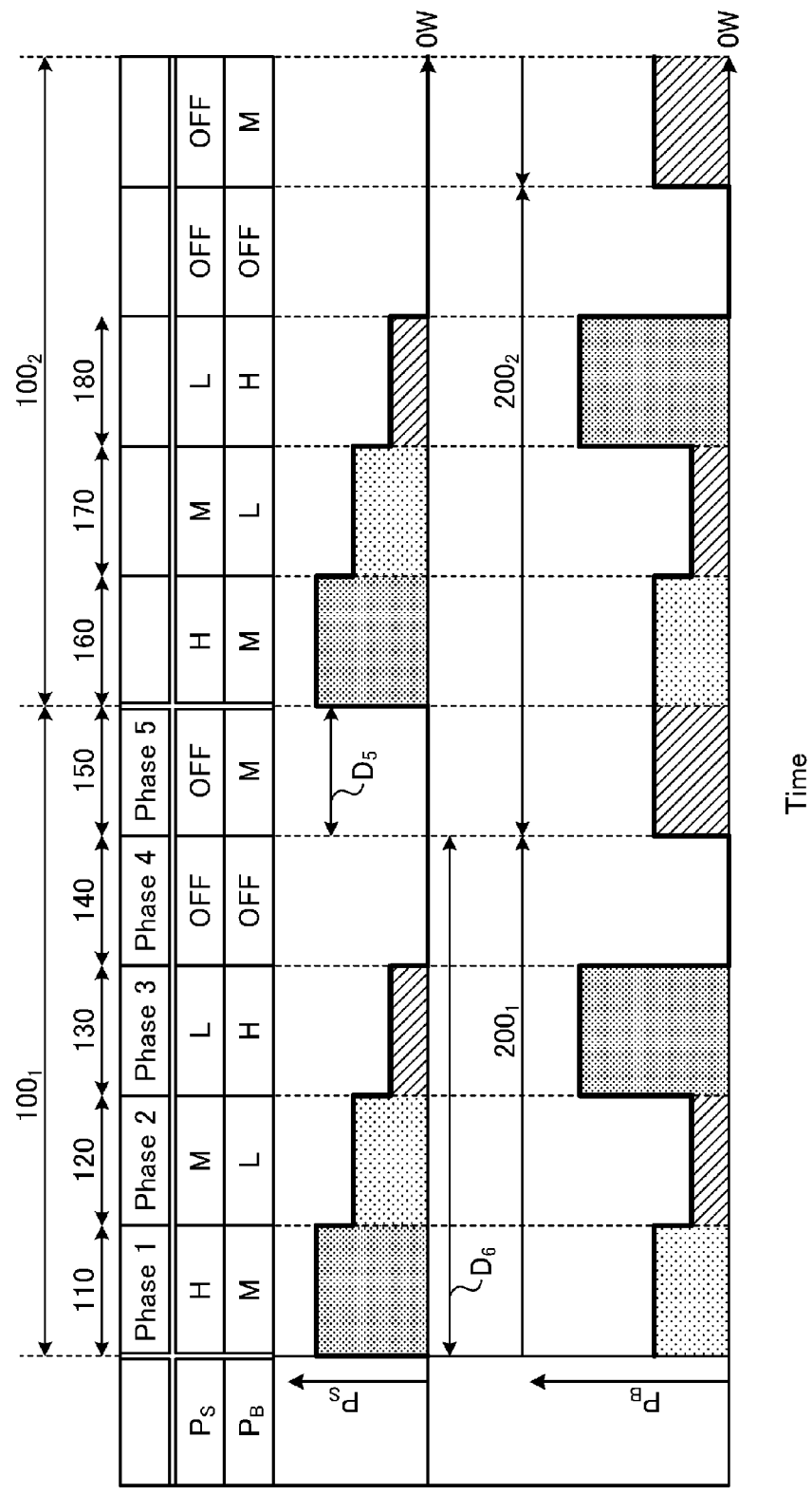
FIG. 8 is a view for explaining an example of four-level waveforms of RF signals used for the plasma processing according to the embodiment.

FIG. 8 is a view for explaining an example of four-level waveforms of RF signals used for the plasma processing according to the embodiment. Unlike in the waveform examples in FIGS. 5 and 7, in the waveform example of FIG. 8, each of the source power $P_S$ and the bias power $P_B$ transitions to four levels. The four levels include an OFF state, and three ON states, that is, a high level, a middle level, and a low level. During one cycle 100, the source power $P_S$ transitions in the order of the high level, the middle level, the low level, and the OFF state. Meanwhile, during one cycle 200, the bias power $P_B$ transitions in the order of the middle level, the low level, the high level, and the OFF state. In the example illustrated in FIG. 8, the source ON state (110, 120, and 130) has a first source power level (High) during a first source period (110), a second source power level (Middle) during a second source period (120), and a third source power level (Low) during a third source period (130). The first source power level (High) is higher than the third source power level (Low), and the second source power level (Middle) has a magnitude between the first source power level (High) and the third source power level (Low). The bias ON state (150, 160, 170, and 180) has a first bias power level (Middle) during a first bias period (150 and 160), a second bias power level (Low) during a second bias period (170), and a third bias power level (High) during a third bias period (180). The third bias power level (High) is higher than the second bias power level (Low), and the first bias power level (Middle) has a magnitude between the second bias power level (Low) and the third bias power level (High).

In the example of FIG. 8, one cycle 100 of the source RF signal is divided into five periods of a first phase 110, a second phase 120, a third phase 130, a fourth phase 140, and a fifth phase 150 according to a combination of levels of the source power $P_S$ and the bias power $P_B$.

In the example of FIG. 8, the timing at which the source power $P_S$ transitions from the OFF state to the ON state is delayed from the timing at which the bias power $P_B$ transitions from the OFF state to the ON state, by a period $D_5$. Inversely, the rise of the bias RF signal is delayed from the rise of the source RF signal, by a period $D_6$. Other timings of state transition are the same between the source power $P_S$ and the bias power $P_B$.

In the first phase 110, the source power $P_S$ transitions from the OFF state to the high level. The bias power $P_B$ is supplied at the middle level. When the second phase 120 is reached, the source power $P_S$ transitions from the high level to the middle level. Meanwhile, the bias power $P_B$ transitions from the middle level to the low level. When the following third phase 130 is reached, the source power $P_S$ transitions from the middle level to the low level. Meanwhile, the bias power $P_B$ transitions from the low level to the high level. Then, in the fourth phase 140, both the source power $P_S$ and the bias power $P_B$ transition to the OFF states. In the following fifth phase 150, only the bias power $P_B$ transitions from the OFF state to the middle level, and the source power $P_S$ is maintained in the OFF state.

In the first phase 110, both the source power $P_S$ and the bias power $P_B$ are supplied and then reactive species are generated in the plasma processing space 10$s$. Thus, etching proceeds.

In the second phase 120, both the source power $P_S$ and the bias power $P_B$ are switched to relatively low levels. Thus, the amount of generated reactive species is reduced, and correspondingly, the amount of generated by-products is reduced.

In the third phase 130, the source power $P_S$ is reduced whereas the bias power $P_B$ is switched to the high level. For this reason, like in the period 3 of FIG. 6D, ion energy increases in the spike shape, and the corner of the bottom of a pattern is etched. Thus, the third phase fulfills a role of making the side wall of the pattern vertical.

In the fourth phase 140, both the source power $P_S$ and the bias power $P_B$ transition to the OFF states. Thus, by-products or radicals within the plasma processing space 10s are exhausted.

In the fifth phase 150, only the bias power $P_B$ is supplied at the middle level. At this point in time, since radicals remain within the plasma processing space 10s, the etching slowly proceeds due to a drawing force of the ion energy so that blockage of an opening is prevented.

As described above, even with the waveform example of FIG. 8, it is possible to realize the etching while suppressing the shape abnormality of the pattern as illustrated in FIGS. 12A to 12C.

In the example of FIG. 8, the relationship between each phase and a parameter set is as follows. The first phase 110 is defined by a parameter set $\{P_{S1}, P_{B1}, t_1\}$. The second phase 120 is defined by a parameter set $\{P_{S2}, P_{B2}, t_2\}$. The third phase 130 is defined by a parameter set $\{P_{S3}, P_{B3}, t_3\}$. The fourth phase 140 is defined by a parameter set $\{P_{S4}, P_{B4}, t_4\}$. The fifth phase 150 is defined by a parameter set $\{P_{S5}, P_{B5}, t_5\}$.

Here, the following relationships are established.

$P_{S1} > P_{S2} > P_{S3} > 0$ $P_{S4} = P_{S5} = 0$ $P_{B3} > P_{B1} = P_{B5} > P_{B2} > 0$ $P_{B4} = 0$ $t_1 > 0$ $t_2 > 0$ $t_3 > 0$ $t_4 > 0$ $t_5 = D_5 > 0$

Duty Ratio

Meanwhile, descriptions have been made to the effect that ON-state duty ratios of the source RF signal and the bias RF signal may be individually set in a range of about 3% to 90%.

For example, in the case of a three-level waveform, for the source RF signal at the high level, the ON-state duty ratio may be set within a range of about 5% to about 50%. For the source RF signal at the low level, the ON-state duty ratio may be set within a range of 0% to about 45%. The OFF-state duty ratio of the source RF signal may be set within a range of about 5% to about 90%.

For the bias RF signal at the high level, the ON-state duty ratio may be set within a range of about %% to about 50%. For the bias RF signal at the low level, the ON-state duty ratio may be set within a range of 0% to about 45%. The OFF-state duty ratio of the bias RF signal may be set within a range of about 5% to about 90%.

The length of a period in which the source RF signal and the bias RF signal are simultaneously placed in OFF states may be set such that duty ratios range from about 5% to about 90%. This period may be set within a range of, for example, about 0 microseconds to about 500 microseconds, more preferably, within a range of about 10 microseconds to about 50 milliseconds. This period may be set such that the duty ratios of the source RF signal and the bias RF signal range from about 10% to about 50%.

Delay Between Source RF Signal and Bias RF Signal

In the waveform examples of FIG. 5 and FIG. 8, a delay is provided between the rise of the source RF signal and the rise of the bias RF signal. The delay may be arbitrarily set within a range of, for example, −100% to +100% relative to one cycle. Here, −100% to +100% is set by using a period from the fall of the source RF signal to the rise of the bias RF signal, as a reference. FIGS. 9A to 9D are views for explaining the delay in RF signals in the embodiment. FIGS. 9A to 9D are delay setting examples in the waveform example of FIG. 5.

Figure 9A:
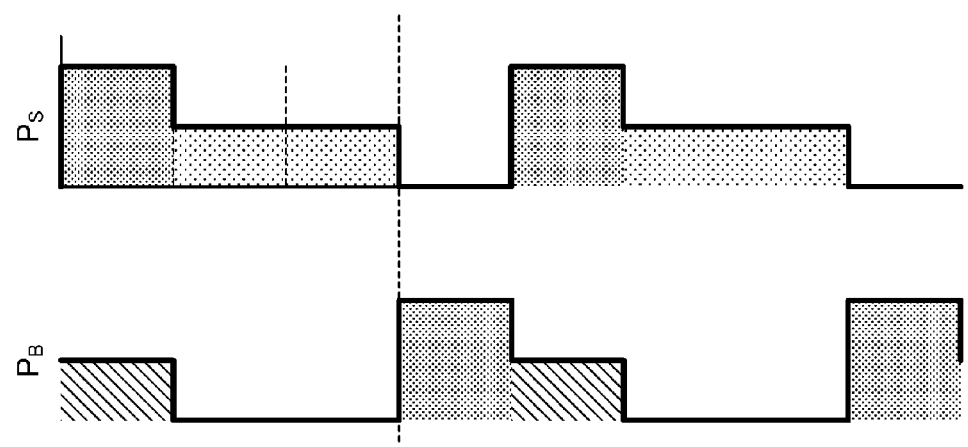
FIG. 9A is a view for explaining a delay in RF signals used for the plasma processing according to the embodiment.

FIG. 9A is a case where the fall of the source RF signal coincides with the rise of the bias RF signal. Here, such a case is defined as a delay of 0%.

Figure 9B:
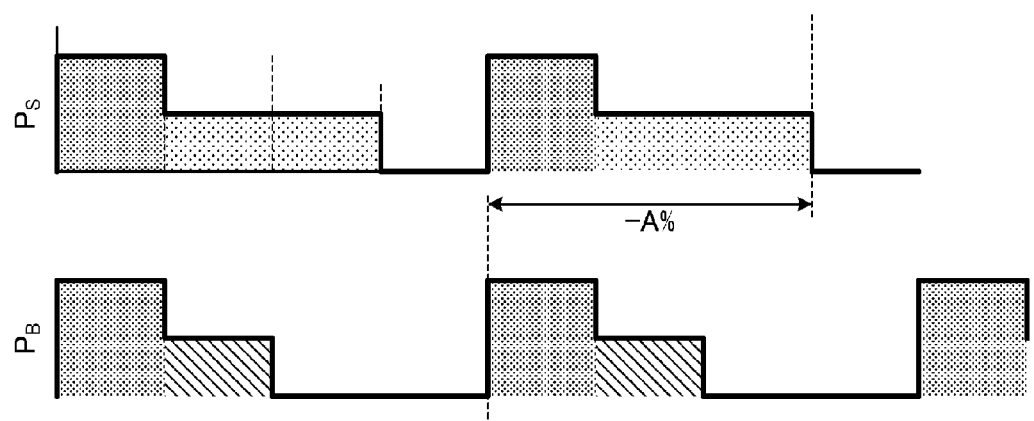
FIG. 9B is another view for explaining a delay in RF signals used for the plasma processing according to the embodiment.

FIG. 9B is a case where the fall of the source RF signal is shifted with respect to the rise of the bias RF signal, by the ON state of the source RF signal prior to the rise of the source signal. When it is assumed that the duty ratio of the ON state of the source RF signal is A %, the delay in this case is −A %.

Figure 9C:
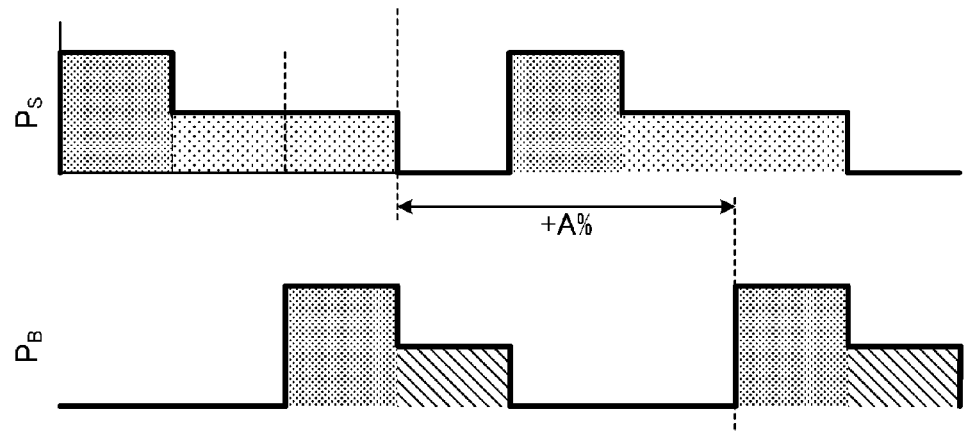
FIG. 9C is yet another view for explaining a delay in RF signals used for the plasma processing according to the embodiment.

Like FIG. 9B, FIG. 9C is a case where the fall of the source RF signal is shifted with respect to the rise of the bias RF signal by the ON state of the source RF signal. Meanwhile, in FIG. 9C, the fall of the source RF signal comes first, and the rise of the bias RF signal comes later. The delay in this case is +A %.

Figure 9D:
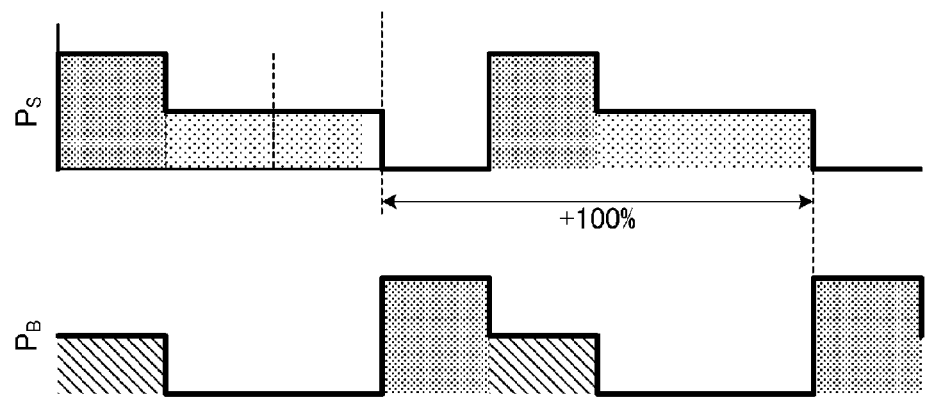
FIG. 9D is yet another view for explaining a delay in RF signals used for the plasma processing according to the embodiment.

FIG. 9D is a case where the rise of the bias RF signal is delayed from the fall of the source RF signal, by +100%. That is, the rise of the bias RF signal is later than the fall of the source RF signal by one cycle of the source RF signal.

As can be seen from these examples, a mode in which the source RF signal and the bias RF signal are superimposed is not particularly limited.

Flow of Supplying of RF Power

FIG. 10 is a view for explaining combination sequences of power levels in supplying RF power in the plasma processing according to the embodiment.

FIG. 10 summarizes combination sequences of power levels in the waveform examples in FIGS. 5, 7 and 8. In FIG. 10, the high level, the middle level, the low level, and the OFF state are denoted by H, M, L, and OFF, respectively. As illustrated in FIG. 10, in the case of the three-level waveforms of FIG. 5, $\{P_S, P_B\}$ transitions in the order of {H, OFF}, {L, H}, {L, L}, and {OFF, OFF}. In the case of the three-level waveforms of FIG. 7, $\{P_S, P_B\}$ transitions in the order of {L, L}, {L, H}, {H, H}, {OFF, H}, and {OFF, OFF}. In the case of the four-level waveforms of FIG. 8, {$P_S$, $P_B$} transitions in the order of {H, M}, {M, L}, {L, H}, {OFF, OFF}, and {OFF, M}.

Following things are common to the waveforms.

(1) There is a period in which both the source power $P_S$ and the bias power $P_B$ are in the OFF states.

(2) There is a period in which both the source power $P_S$ and the bias power $P_B$ are in the ON states, but levels are different.

(3) There is a period in which one of the source power $P_S$ and the bias power $P_B$ is in the OFF state, and the other is in the ON state.

As described above, in a plasma processing method according to the embodiment, the supply mode of the source power $P_S$ and the bias power $P_B$, for example, a combination of levels of the source power $P_S$ and the bias power $P_B$, is provided as a plurality of patterns. Thus, according to the embodiment, it is possible to finely control the state of plasma within the plasma processing space 10s according to the degree of progress of the plasma processing while executing the plasma processing. For this reason, according to the embodiment, it is possible to realize plasma etching while preventing an abnormality of a pattern shape on the substrate.

Figure 11:
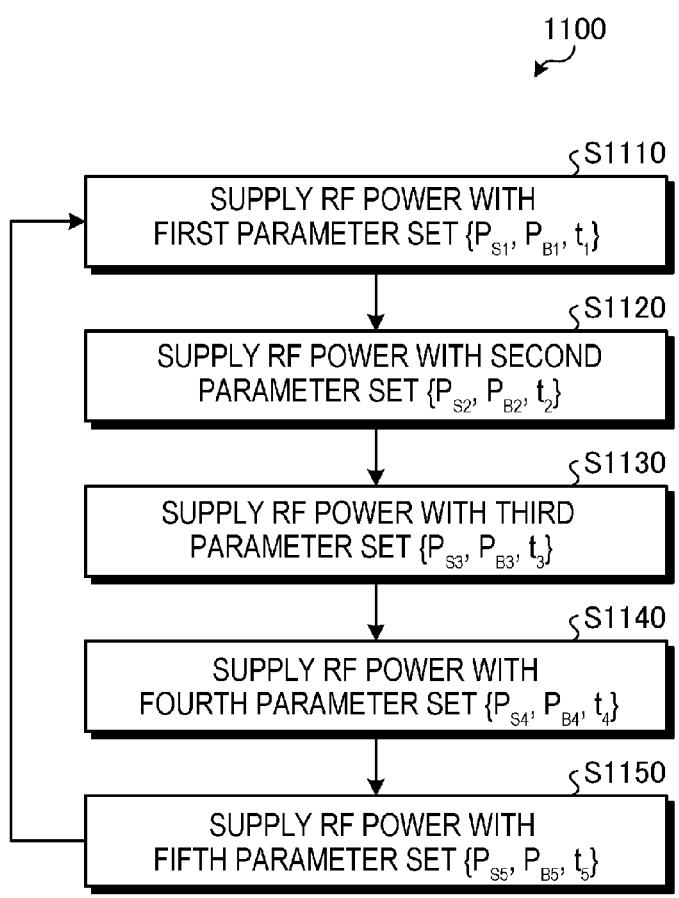
FIG. 11 is a flow chart illustrating an example of the flow in supplying RF power in the plasma processing according to the embodiment.

FIG. 11 is a flow chart illustrating an example of the flow in supplying RF power in the plasma processing according to the embodiment. The flow 1100 illustrated in FIG. 11 is executed in, for example, step S32 of FIG. 3.

First, under the control of the controller, the RF power supply 31 executes RF-power supply defined by the first parameter set {$P_{S1}$, $P_{B1}$, $t_1$} (step S1110).

Next, under the control of the controller, the RF power supply 31 executes RF-power supply defined by the second parameter set {$P_{S2}$, $P_{B2}$, $t_2$} (step S1120).

Next, under the control of the controller, the RF power supply 31 executes RF-power supply defined by the third parameter set {$P_{S3}$, $P_{B3}$, $t_3$} (step S1130).

Next, under the control of the controller, the RF power supply 31 executes RF-power supply defined by the fourth parameter set {$P_{S4}$, $P_{B4}$, $t_4$} (step S1140).

Next, under the control of the controller, the RF power supply 31 executes RF-power supply defined by the fifth parameter set {$P_{S5}$, $P_{B5}$, $t_5$} (step S1150).

Steps S1110 to S1150 are executed as one cycle. After step S1150, the process may subsequently return to step S1110 so that a cycle may be executed again.

Among the first to fifth parameter sets, any two may be the same. In this case, RF-power supply based on the three-level waveforms of FIG. 5 may be executed.

Among the first to fifth parameter sets, in at least one parameter set, {$P_{SX}$, $P_{BX}$} (where X is any integer of 1 to 5) may be {$P_{SOFF}$, $P_{BOFF}$}. In this case, as in the waveform examples of FIGS. 5, 7, and 8, the supply of both the source power $P_S$ and the bias power $P_B$ may be stopped in any phase.

Among the first to fifth parameter sets, in at least one parameter set, {$P_{SY}$, $P_{BY}$} (where Y≠X, and Y is an integer of 1 to 5) may be {$P_{S\alpha}$, $P_{B\beta}$}. Meanwhile, α≠β, and each of α and β is any one of H, L, and M. In this case, as in the waveform examples of FIGS. 5, 7, and 8, the source power $P_S$ and the bias power $P_B$ may be supplied at different levels in any phase.

Among the first to fifth parameter sets, in at least one parameter set, {$P_{SZ}$, $P_{BZ}$} (where Z≠X, Z≠Y, and Z is an integer of 1 to 5) may be {$P_{S\gamma}$, $P_{B\delta}$} (where {γ, δ}≠{α, β}). Meanwhile, one of γ and δ is OFF, and the other is any one of H, L, and M. In this case, as in the waveform examples in FIGS. 5, 7, and 8, the supply of one of the source power $P_S$ and the bias power $P_B$ may be stopped and the supply of the other may be executed in any phase.

A part of the embodiment and modifications may be properly changed. Hereinafter, conceivable modified modes will be described.

Other Embodiments

The source power $P_S$ may be alternating current (AC) power. The source power $P_S$ may be RF power, or very high frequency (VHF) power. The source power $P_S$ may be RF power within a range of, for example, about 60 MHz to about 200 MHz. The source power $P_S$ may be RF power within a range of, for example, about 25 MHz to about 60 MHz. The source power $P_S$ may have, for example, 27 MHz. In the embodiment, the source power $P_S$ generates inductively coupled plasma (ICP). The source power PS generates plasma by coupling to, for example, helical antenna.

The bias power $P_B$ may be alternating current (AC) power. The bias power $P_B$ may be direct current (DC) pulse power. The bias power $P_B$ may be any one of RF power, high frequency (HF) power, and medium frequency (MF) power. The bias power $P_B$ may be power of a frequency ranging from, for example, about 200 kHz to about 600 kHz. The bias power $P_B$ may have, for example, 400 kHz. The bias power $P_B$ may be power within a range of, for example, about 600 kHz to about 13 MHz.

Each of the source power $P_S$ and the bias power $P_B$ may be applied as a single pulse, or as successive pulses in each cycle. For example, in the first phase, the source power $P_{S1}$ applied during the period $t_1$ may be a single pulse, or successive pulses. Likewise, the bias power $P_{B3}$ applied during the period $t_3$ may be a single pulse or successive pulses.

A gas is supplied to the plasma processing chamber 10, at a flow rate selected according to a predetermined plasma processing. During one cycle, the gas is supplied to the plasma processing chamber 10 at substantially the same flow rate. The supplied gas contains, for example, hydrogen bromide (HBr). The supplied gas contains rare gas such as, for example, helium (He) or argon (Ar). The supplied gas may contain, for example, oxygen ($O_2$), tetrafluoromethane ($CF_4$), nitrogen trifluoride ($NF_3$), sulfur hexafluoride ($SF_6$), chlorine ($Cl_2$), or tetrachloromethane ($CCl_4$).

A by-product generated during the plasma processing according to the embodiment may be a compound containing a gas within the plasma processing chamber 10, and one or more types of elements included in a composition of the substrate. For example, when a silicon substrate and HBr gas are used, by-products containing SiBrx may be formed. Besides, for example, silicon-containing residues such as silicon fluoride (SiFx) or silicon chloride (SiClx), or carbon-containing residues such as fluorocarbon (CFx) or hydrofluorocarbon (CHxFy) (in the case of processing using a photoresist, an organic film, or a precursor) may be also formed as by-products.

In the embodiment, the materials of a film to be etched and a mask used for etching are not particularly limited. For example, the underlayer L1 (see FIGS. 4A to 4C) may be a silicon wafer. The etching target layer L2 may be a dielectric film, for example, a silicon-containing dielectric film. The etching target layer L2 may be formed by stacking a plurality of types of films. For example, the etching target layer L2 may be a layer obtained by sequentially stacking a silicon oxide film and a silicon nitride film. The etching target layer L2 may be a layer obtained by sequentially stacking a silicon oxide film and a polysilicon film. The mask MK may be a carbon-containing film. The carbon-containing film may be formed of an amorphous carbon layer (ACL), or a spin-on carbon (SOC) film. Otherwise, the mask MK may be formed of a metal film. Although not illustrated in FIGS. 4A to 4C, a silicon oxynitride film (SiON) or a bottom antireflective coating (BARC) in which the same opening pattern as that of the mask MK is formed may be present on the mask MK.

In the plasma processing method according to the embodiment, when the etching target layer L2 is a silicon-containing dielectric film, the mask MK may be a carbon-containing film such as an ACL or a SOC. When the etching target layer L2 is a polysilicon film, the mask MK may be, for example, a silicon oxide film formed by using tetra-ethoxysilane (TEOS).

In the embodiment, a plurality of source RF generators 31a and a plurality of bias RF generators 31b may be disposed. In this case, each source RF generator 31a may supply a predetermined fixed amount of power to the coil at a predetermined timing. Likewise, each bias RF generator 31b may supply a predetermined fixed amount of power to the lower electrode at a predetermined timing.

A pulse sequence of an RF signal according to the embodiment may be freely set for the plasma processing apparatus 1 by a user according to a pattern shape to be formed on the substrate and then may be executed. For example, the user may select one of patterns stored in a storage and cause the selected pattern to be executed, or may store a new sequence pattern in the storage.

Effect of Embodiment

As described above, the plasma processing apparatus according to the embodiment includes a plasma processing chamber, at least one coil, a substrate support, a source RF generator, and a bias RF generator. At least one coil is disposed above the plasma processing chamber. The substrate support is disposed within the plasma processing chamber, and has a lower electrode. The source RF generator is configured to supply a source RF signal to at least one coil. The source RF signal includes source cycles, and each of the source cycles includes a source ON state and a source OFF state. The source ON state has at least two source power levels. The bias RF generator is configured to supply a bias RF signal to the lower electrode. The bias RF signal includes bias cycles corresponding to the source cycles, respectively. Each of the bias cycles includes a bias ON state and a bias OFF state. The bias ON state has at least two bias power levels. A transition timing to the bias ON state in a first bias cycle is shifted with respect to a transition timing to the source ON state in a first source cycle corresponding to the first bias cycle. As described above, the plasma processing apparatus may change RF power to be supplied to the coil and the lower electrode at different timings. The plasma processing apparatus may transition the RF power to be supplied to the coil and the lower electrode to different states. Thus, it is possible to finely control the state of plasma generated within the plasma processing chamber according to a shape of a pattern to be formed by plasma processing. Therefore, the plasma processing apparatus may improve the processing performance of plasma etching.

In the plasma processing apparatus according to the embodiment, the transition timing to the bias ON state may be delayed from the transition timing to the source ON state.

In the plasma processing apparatus according to the embodiment, a transition timing to the bias OFF state in the first bias cycle may be substantially the same as a transition timing to the source OFF state in the first source cycle.

The plasma processing apparatus according to the embodiment may include a plasma processing chamber, at least one coil, a substrate support, a source RF generator, and a bias RF generator. At least one coil is disposed above the plasma processing chamber. The substrate support is disposed within the plasma processing chamber, and has a lower electrode. The source RF generator is configured to supply a source RF signal to at least one coil. The source RF signal includes source cycles. Each of the source cycles includes a source ON state and a source OFF state. The source ON state has at least two source power levels. The bias RF generator is configured to supply a bias RF signal to the lower electrode. The bias RF signal includes bias cycles corresponding to the source cycles, respectively. The bias cycle includes a bias ON state and a bias OFF state. The bias ON state has at least two bias power levels. A transition timing to the bias OFF state in a first bias cycle is shifted with respect to a transition timing to the source OFF state in a first source cycle corresponding to the first bias cycle.

In the plasma processing apparatus according to the embodiment, the transition timing to the bias OFF state may be delayed from the transition timing to the source OFF state.

In the plasma processing apparatus according to the embodiment, a transition timing to the bias ON state in the first bias cycle may be substantially the same as a transition timing to the source ON state in the first source cycle.

In the plasma processing apparatus according to the embodiment, a period of the source OFF state may partially overlap a period of the bias OFF state.

In the plasma processing apparatus according to the embodiment, the source ON state may have a first source power level during a first source period, and a second source power level during a second source period subsequent to the first source period. The first source power level may be higher than the second source power level.

In the plasma processing apparatus according to the embodiment, the bias ON state may have a first bias power level during a first bias period, and a second bias power level during a second bias period subsequent to the first bias period. The first bias power level may be higher than the second bias power level.

In the plasma processing apparatus according to the embodiment, the bias RF signal may have a bias OFF period during the first source period.

In the plasma processing apparatus according to the embodiment, the first bias period and the second bias period may partially overlap the second source period. The bias RF signal may transition from the first bias power level to the second bias power level during the second source period.

In the plasma processing apparatus according to the embodiment, the source ON state may have a first source power level during a first source period, and a second source power level during a second source period subsequent to the first source period. The second source power level may be higher than the first source power level.

In the plasma processing apparatus according to the embodiment, the bias ON state may have a first bias power level during a first bias period, and a second bias power level during a second bias period subsequent to the first bias period. The second bias power level may be higher than the first bias power level.

In the plasma processing apparatus according to the embodiment, the source ON state may have a first source power level during a first source period, a second source power level during a second source period subsequent to the first source period, and a third source power level during a third source period subsequent to the second source period. The first source power level may be higher than the third source power level. The second source power level may have a magnitude between the first source power level and the third source power level. The bias ON state may have a first bias power level during a first bias period, a second bias power level during a second bias period subsequent to the first bias period, and a third bias power level during a third bias period subsequent to the second bias period. The third bias power level may be higher than the second bias power level. The first bias power level may have a magnitude between the second bias power level and the third bias power level.

For example, in the embodiments, an inductively coupled plasma apparatus has been described as an example, but the present disclosure is not limited thereto and may be applied to other plasma apparatuses. For example, instead of the inductively coupled plasma apparatus, a capacitively coupled plasma (CCP) apparatus may be used. In this case, the capacitively coupled plasma apparatus includes two opposing electrodes disposed within the plasma processing chamber. In the embodiment, one electrode is disposed within the substrate support, and the other electrode is disposed above the substrate support. In this case, one electrode functions as a lower electrode, and the other electrode functions as an upper electrode. Then, the source RF generator 31a and the bias RF generator 31b are coupled to at least one of the two opposing electrodes. In the embodiment, the source RF generator 31a is coupled to the upper electrode, and the bias RF generator 31b is coupled to the lower electrode. The source RF generator 31a and the bias RF generator 31b may be coupled to the lower electrode.

According to the present disclosure, it is possible to improve the processing performance of plasma etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
    a controller;
    a plasma processing chamber;
    a substrate support disposed within the plasma processing chamber;
    a source RF generator coupled to the plasma processing chamber, and the controller is configured to control the source RF generator to generate a source RF signal having a first source power level greater than 0 during a first period at each cycle, a second source power level different from the first source power level and greater than 0 during a second period subsequent to the first period at each cycle, the second source power level during a third period subsequent to the second period at each cycle, and a zero power level during a fourth period subsequent to the third period at each cycle; and
    a bias RF generator coupled to the substrate support, and the controller is configured to control the bias RF generator to generate a bias RF signal having a zero power level during the first period, the zero power level during a delay time at the second period, a first bias power level greater than 0 during the second period excluding the delay time, a second bias power level different from the first bias power level and greater than 0 during the third period, the zero power level during the fourth period.

2. The plasma processing apparatus according to claim 1, wherein the second source power level is lower than the first source power level.

3. The plasma processing apparatus according to claim 1, wherein the second bias power level is lower than the first bias power level.

4. The plasma processing apparatus according to claim 1, wherein the delay time starts at a transition from the first source power level to the second source power level and ends at a start of the first bias power level.

* * * * *